United States Patent
Hariharan et al.

(10) Patent No.: US 11,075,117 B2
(45) Date of Patent: Jul. 27, 2021

(54) DIE SINGULATION AND STACKED DEVICE STRUCTURES

(71) Applicant: Xilinx, Inc., San Jose, CA (US)

(72) Inventors: Ganesh Hariharan, Milpitas, CA (US); Raghunandan Chaware, Sunnyvale, CA (US); Inderjit Singh, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 15/904,764

(22) Filed: Feb. 26, 2018

(65) Prior Publication Data

US 2019/0267287 A1  Aug. 29, 2019

(51) Int. Cl.
| | |
|---|---|
| *H01L 21/78* | (2006.01) |
| *H01L 21/56* | (2006.01) |
| *H01L 25/00* | (2006.01) |
| *H01L 25/065* | (2006.01) |
| *H01L 21/263* | (2006.01) |
| *H01L 21/683* | (2006.01) |

(Continued)

(52) U.S. Cl.
CPC ............ *H01L 21/78* (2013.01); *H01L 21/561* (2013.01); *H01L 21/563* (2013.01); *H01L 23/3178* (2013.01); *H01L 23/3185* (2013.01); *H01L 25/50* (2013.01); *H01L 21/2633* (2013.01); *H01L 21/30655* (2013.01); *H01L 21/6836* (2013.01); *H01L 2221/68327* (2013.01); *H01L 2224/16148* (2013.01); *H01L 2224/16238* (2013.01); *H01L 2924/10156* (2013.01)

(58) Field of Classification Search
CPC . H01L 21/78; H01L 23/3178; H01L 23/3185; H01L 21/563; H01L 2924/10156; H01L 25/50; H01L 21/30655; H01L 21/561; H01L 21/3065; B23K 26/0093
See application file for complete search history.

(56) References Cited

U.S. PATENT DOCUMENTS

| | | | |
|---|---|---|---|
| 7,767,554 B2 * | 8/2010 | Arita ................... | H01L 21/3043 257/E21.238 |
| 8,912,078 B1 * | 12/2014 | Lei ........................ | H01L 21/268 438/462 |

(Continued)

OTHER PUBLICATIONS

Burckel, D. Bruce et al., "Oblique Patterned Etching of Vertical Silicon Sidewalls," Applied Physics Letters, Apr. 4, 2016, 7 pages, vol. 108.

(Continued)

*Primary Examiner* — Marcos D. Pizarro
*Assistant Examiner* — Antonio B Crite
(74) *Attorney, Agent, or Firm* — Haynes and Boone, LLP

(57) ABSTRACT

Techniques for singulating dies from a respective workpiece and for incorporating one or more singulated die into a stacked device structure are described herein. In some examples, singulating a die from a workpiece includes chemically etching the workpiece in a scribe line. In some examples, singulating a die from a workpiece includes mechanically dicing the workpiece in a scribe line and forming a liner along a sidewall of the die. The die can be incorporated into a stacked device structure. The die can be attached to a substrate along with another die that is attached to the substrate. An encapsulant can be between each die and the substrate and laterally between the dies.

20 Claims, 16 Drawing Sheets

(51) Int. Cl.
*H01L 21/3065* (2006.01)
*H01L 23/00* (2006.01)
*H01L 23/31* (2006.01)

(56) References Cited

U.S. PATENT DOCUMENTS

| | | | |
|---|---|---|---|
| 9,275,902 B2* | 3/2016 | Lei | H01L 21/78 |
| 9,496,193 B1* | 11/2016 | Roesner | H01L 21/6836 |
| 2015/0102468 A1* | 4/2015 | Kang | H01L 24/92 |
| | | | 257/621 |
| 2015/0332970 A1* | 11/2015 | Lei | H01L 21/6836 |
| | | | 438/462 |
| 2017/0236765 A1* | 8/2017 | Tamagawa | H01L 23/3185 |
| | | | 257/622 |
| 2017/0263462 A1* | 9/2017 | Okita | H01L 21/68785 |
| 2018/0269181 A1* | 9/2018 | Yang | H01L 25/0655 |

OTHER PUBLICATIONS

Louriki, Latifa et al., "Multilayer Micromechanics Process with Thick Functional Layers (EPyC40)," Proceedings, Aug. 17, 2017, 4 pages, vol. 1, MDPI Ag, Basel, Switzerland.

* cited by examiner

US 11,075,117 B2

DIE SINGULATION AND STACKED DEVICE STRUCTURES

TECHNICAL FIELD

Examples of the present disclosure generally relate to die singulation and stacked device structures and, in particular, to processes for singulating dies from a workpiece for improved characteristics in a stacked device structure.

BACKGROUND

Generally, the semiconductor processing industry has developed stacked technology where an integrated circuit formed on a die is stacked on another substrate. An example of stacked technology includes what is known as 2.5-Dimensional Integrated Circuit (2.5DIC), where one or more dies (each having an integrated circuit formed thereon) are stacked on an interposer. Another example includes what is known as 3-Dimensional Integrated Circuit (3DIC), where one or more dies (each having an integrated circuit formed thereon) are stacked on another die (that also has an integrated circuit formed thereon). In other examples, multiple levels of stacking dies with or without interposers may be implemented.

Some benefits of stacked technology can be higher density, smaller footprints, shorter electrical routing, and reduced power consumption. For example, vertical integration of dies can reduce the area used to connect the stacked dies to a package substrate. Additionally, conductive routes for electrical signals can, in some instances, include portions that are vertical to connect to another die, which can reduce the distances that electrical signals travel. The reduced distances can decrease resistance, and in turn, can decrease power consumption and propagation delay.

SUMMARY

Examples of the present disclosure generally relate to techniques for singulating dies and to stacked device structures including a singulated die. Various singulation processes described herein can improve robustness and reliability of a stacked device structure.

An example of the present disclosure is a structure. The structure includes a substrate, a first die attached to the substrate, and an encapsulant between the first die and the substrate. The first die has a first sidewall, and the first sidewall has at least one first indentation. The encapsulant is disposed in the first indentation and adhered to a first surface of the first indentation.

Another example of the present disclosure is a method of integrated circuit packaging. The method includes singulating a first die from a first workpiece, attaching the first die to a first area of a substrate, and forming an encapsulant on the substrate. Singulating the first die includes chemically removing material from the first workpiece in a first scribe line. The encapsulant is further formed between the first area and the first die, and adhered to a first sidewall of the first die.

Yet another example of the present disclosure is a structure. The structure includes a substrate, a first die attached to the substrate, and an encapsulant between the first die and the substrate. The first die has a first sidewall, and a first liner is along the first sidewall. The encapsulant is adhered to the first liner.

Yet another example of the present disclosure is a method of integrated circuit packaging. The method includes singulating a first die from a first workpiece, attaching the first die to a first area of a substrate, and forming an encapsulant on the substrate. Singulating the first die includes mechanically dicing the first workpiece in a first scribe line and forming a first liner along a first sidewall of the first die. The first sidewall of the first die is formed by mechanically dicing the first workpiece. The encapsulant is further formed between the first area and the first die. The encapsulant is adhered to the first liner.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
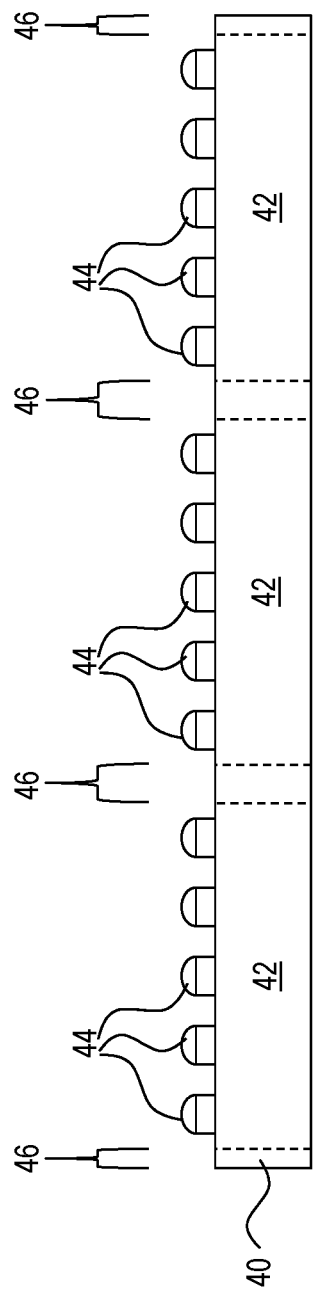
FIGS. 1 through 6 are cross-sectional views of intermediate structures during stages of a general process for forming a stacked device structure, in accordance with examples of the present disclosure.

Examples of the present disclosure provide techniques for singulating dies and provide stacked device structures including a singulated die. Various singulation processes described herein can improve robustness and reliability of the stacked device structure. For example, defects that can induce stress at a die, and therefore, cause a crack in the die, can be reduced using a singulation process described herein, which can in turn, reduce cracking in a stacked device structure. Further, for example, a singulation process described herein can provide a surface with improved adhesion characteristics, which can reduce delamination in a stacked device structure. These and other possible advantages will become apparent from the description herein.

Generally, in some examples, dies can be singulated from a respective workpiece using a non-mechanical process, such as using a chemical etching process. For example, a chemical etching process can be or include a plasma dicing process or other etching processes, which may further include anisotropic and/or isotropic etching processes. The chemical etching process can form one or more indentations in sidewalls of dies that are singulated. The one or more indentations may be or form an undulating sidewall of a die and/or one or more notches in a sidewall of a die. One or more singulated dies singulated using the non-mechanical process can then be incorporated into a stacked device structure having improved robustness and reliability.

Further, in some examples, dies can be singulated from a respective workpiece using a mechanical process, such as mechanical dicing (e.g., mechanical sawing). Sidewalls of dies formed using mechanical dicing can have a liner formed thereon. One or more singulated dies singulated using the mechanical process can then be incorporated into a stacked device structure having improved robustness and reliability.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described.

Example Process for Forming Stacked Device Structure

FIGS. 1 through 6 illustrate cross-sectional views of intermediate structures during stages of a general process for forming a stacked device structure, in accordance with examples of the present disclosure. FIG. 7 is a flow chart of the general process for forming a stacked device structure, in accordance with an example of the present disclosure. Singulation of dies is described generally in this general process with more specific examples of singulation, and resulting stacked device structures, described subsequently.

FIG. 1 illustrates multiple dies 42 formed on a first workpiece 40 (e.g., a wafer). The first workpiece 40 can include, for example, a semiconductor wafer having any diameter, such as 100 mm, 150 mm, 200 mm, 300 mm, 450 mm, or another diameter, and having any thickness, such as 525 μm, 675 μm, 725 μm, 775 μm, 925 μm, or another thickness. Dies 42 are formed on the first workpiece 40 according to a design specification. The dies 42 can include, for example, memory, processors, application specific integrated circuits (ASICs), programmable integrated circuits (e.g., field-programmable gate arrays (FPGAs) or complex programmable logic devices (CPLDs)), or the like. Any number of dies 42 can be formed on the first workpiece 40. The first workpiece 40 can be processed such that electrical connectors 44 are formed on the dies 42. The electrical connectors 44 can include microbumps, such as each having a copper pillar with solder (e.g., lead-free solder) formed thereon. In other examples, the electrical connectors 44 can be other types of electrical connectors. For convenience, the side of the dies 42 on which the electrical connectors 44 are formed is referred to as the "front side" or "active side," whereas the side of the dies 42 opposite from the front side of the dies 42 is referred to as the "back side." Scribe lines 46 are between neighboring dies 42 and along edges of dies 42 that are along an exterior of the first workpiece 40. Various ones of the scribe lines 46 surround each die 42 such that by removing portions of the first workpiece 40 in the scribe lines 46, each die 42 can be singulated from other dies 42 (e.g., dicing the wafer).

Figure 2:
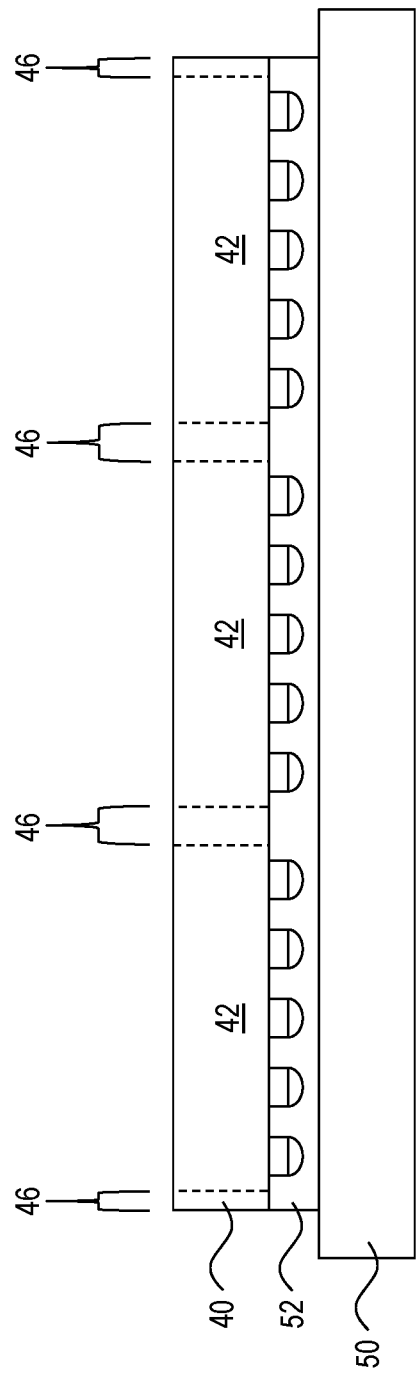

FIG. 2 illustrates attaching the first workpiece 40 to a support structure 50 for singulation of the dies 42 (e.g., after flipping the first workpiece 40 over). The support structure 50 may be, for example, a glass or silicon carrier substrate or metal frame, although other support structures may be used. The first workpiece 40 may be attached to the support structure 50 using an adhesive 52, such as an ultraviolet (UV) tape that loses its adhesive characteristics upon exposure to UV light. The active sides of the dies 42 on the first workpiece 40 are adhered, using the adhesive 52, to the support structure 50, and the back sides of the dies 42 are upward facing away from the support structure 50.

Figure 3:
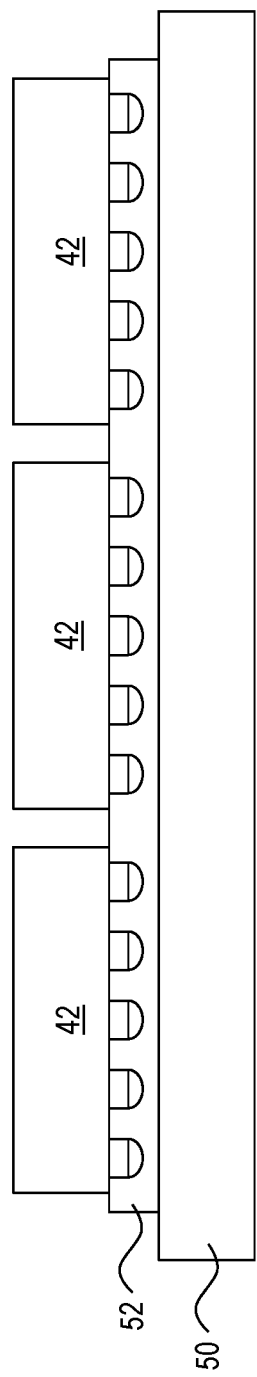

FIG. 3 illustrates the singulation of the dies 42 from the first workpiece 40, which is performed in block 202 of FIG. 7. The portions of the first workpiece 40 along the scribe lines 46 are removed to singulate the dies 42. Example singulation processes are described below, and can be implemented in this general process for forming a stacked device structure or another type of structure. FIG. 3 is not necessarily illustrative of aspects of the dies 42, such as sidewalls of the dies 42, that result from at least some of the singulation processes described below. Further, since portions of the first workpiece 40 along each of the scribe lines 46 may be removed simultaneously during singulation, any aspect of a sidewall of a die 42 described and illustrated with respect to subsequent figures may be generally applied to each sidewall of the die 42, even though each sidewall may not be specifically illustrated or described.

Figure 4:
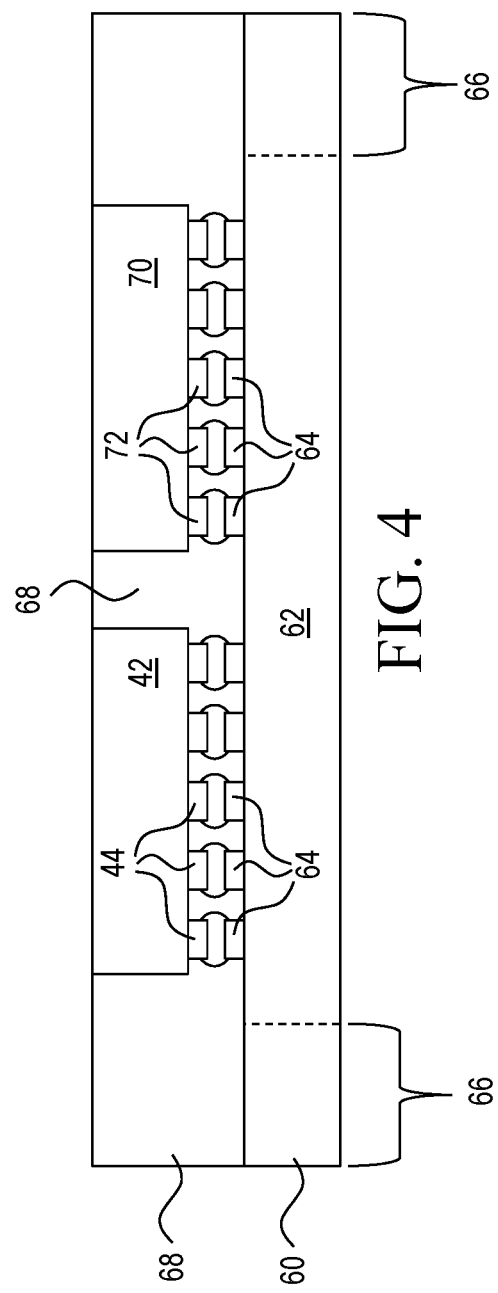

FIG. 4 illustrates attaching at least one of the dies 42 to a substrate 62 formed on a second workpiece 60, which is performed at least partially in block 204 of FIG. 7. The second workpiece 60 can include, for example, a semiconductor wafer as described above for the first workpiece 40, or can include an organic substrate. The substrate 62 can be a die on which an integrated circuit is formed or can be an interposer, in some examples. The substrate 62, when implemented as a die on which an integrated circuit is formed, can include, for example, memory, a processor, an application specific integrated circuit, or the like. An interposer generally does not include active devices, such as transistors, diodes, or the like. Any number of substrates 62 can be formed on the second workpiece 60.

Similar to above, the substrate 62 may be referred to as having a "front side" and a "back side," which terms do not necessarily connote any particular structure. The second workpiece 60 can be processed through front-side processing such that electrical connectors 64 are formed on the substrate 62. For example, during front-side processing, through substrate vias (TSVs) may be formed at least partially through, e.g., the semiconductor wafer of the second workpiece 60. The TSVs may be electrically connected to one or more redistribution metal layers on the front side of the substrate 62. The electrical connectors 64 can include microbumps, such as each having a copper pillar with or without solder (e.g., lead-free solder) formed thereon. In other examples, the electrical connectors 64 can be other types of electrical connectors. Scribe lines 66 may be disposed between neighboring substrates 62 and along edges of substrates 62 that are along an exterior of the second workpiece 60.

After the dies 42 are singulated from the first workpiece 40, the dies 42 can be detached from the adhesive 52, such as including exposing the adhesive 52 to UV light such that the adhesive 52 loses its adhesive characteristics. A die 42 may then be placed on a first die-attach area of the substrate 62, with the electrical connectors 44 of the die 42 contacting the electrical connectors 64 of the substrate 62 in the first die-attach area. A reflow process may be used to reflow the electrical connectors 44 to the electrical connectors 64, e.g., to reflow solder of the electrical connectors 44 and 64 together, to physically and electrically attach the die 42 to the substrate 62.

Similarly, a die 70 may be attached to a second die-attach area of the substrate 62. The die 70 can be one of the dies 42 or can be another die formed on another workpiece. The die 70 can undergo processing similar to the general process described above with respect to FIGS. 1 through 3, and blocks 202 and 204 of FIG. 7, for the die 42. The die 70 can include, for example, memory, a processor, an application specific integrated circuit, a programmable IC, or the like. The die 70 can include electrical connectors 72, which can include microbumps, such as each having a copper pillar with solder (e.g., lead-free solder) formed thereon. In other examples, the electrical connectors 72 can be other types of electrical connectors. After the die 70 is singulated from its workpiece, the die 70 may then be placed on a second die-attach area of the substrate 62, with the electrical connectors 72 of the die 70 contacting the electrical connectors 64 of the substrate 62 in the second die-attach area. A reflow process may be used to reflow the electrical connectors 72 to the electrical connectors 64, e.g., to reflow solder of the electrical connectors 72 and 64 together, to physically and electrically attach the die 70 to the substrate 62. The reflow process used to reflow the electrical connectors 72 and 64 together may be a same or different reflow process as the reflow process used to reflow the electrical connectors 44 and 64 together. Additional dies may be attached to the substrate 62 in other examples.

After the dies 42 and 70 are attached to the substrate 62, in block 206 of FIG. 7, the dies 42 and 70 on the substrate 62 may be encapsulated. An encapsulant 68 may be formed on the front side of the second workpiece 60 and between the dies 42 and 70. For example, the encapsulant 68 can be a mold underfill (MUF) which may be dispensed and molded using a vacuum-assisted mold system. In other examples, the encapsulant 68 can include multiple materials formed in different operations, such as a capillary underfill (CUF) formed using a dispense process and a molding compound subsequently formed using compression molding or another molding process. The encapsulant 68 may be formed between the die 42 and the substrate 62 around the reflowed electrical connectors 44 and 64, between the die 70 and the substrate 62 around the reflowed electrical connectors 72 and 64, and laterally between sidewalls of the dies 42 and 70.

Figure 5:
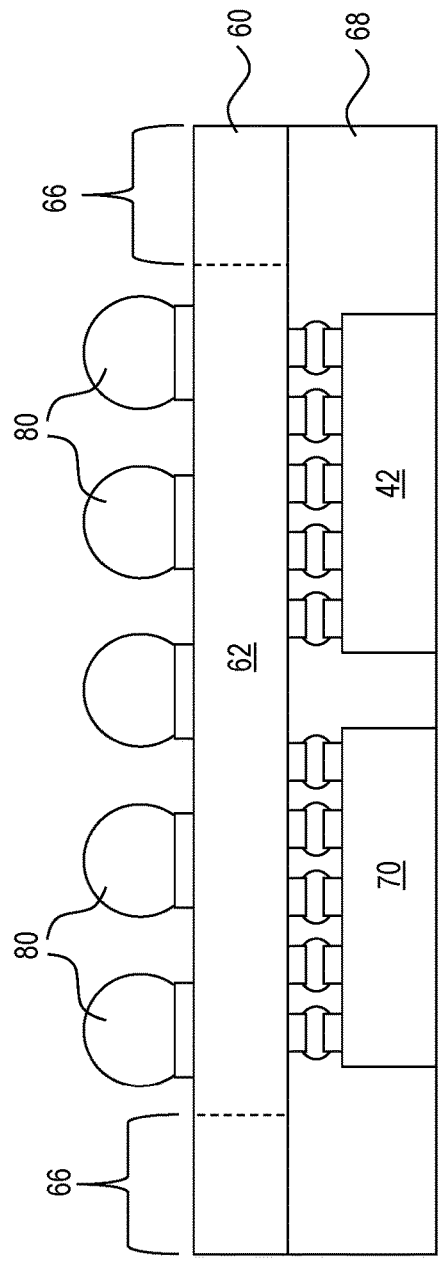

FIG. 5 illustrates back side processing on the second workpiece 60. For example, during back side processing, the TSVs may be exposed through, e.g., the semiconductor wafer of the second workpiece 60 by grinding or polishing the semiconductor wafer, using, for example, a chemical mechanical polish (CMP). One or more redistribution metal layers may be formed on the back side of the substrate 62, to which the TSVs may be electrically connected. Electrical connectors 80 are formed on the back side of the substrate 62, which are also electrically connected to the one or more redistribution metal layers. The electrical connectors 80 can include controlled collapse chip connection (C4) bumps, such as each having an under bump metallization (UBM) with solder (e.g., lead-free solder) formed thereon. In other examples, the electrical connectors 80 can be other types of electrical connectors, such as ball grid array (BGA) balls.

Figure 6:
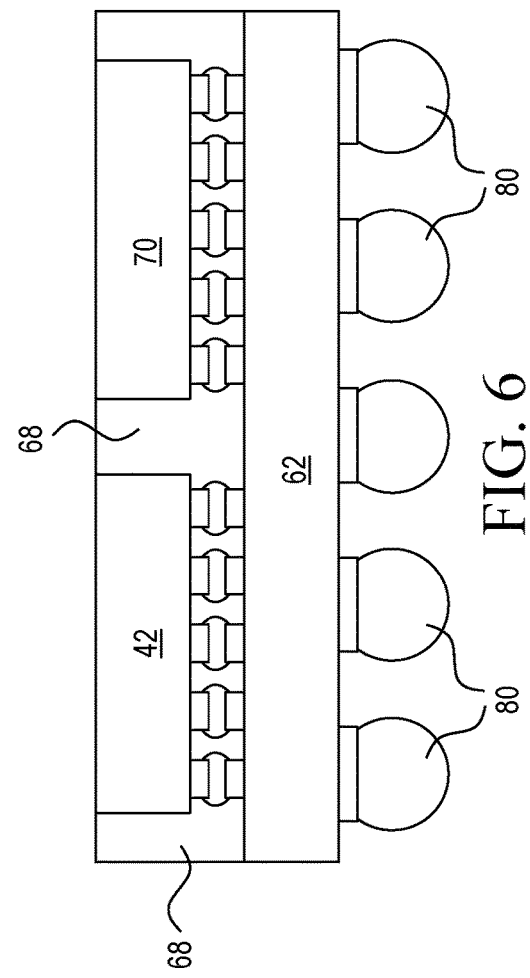
Figure 7:
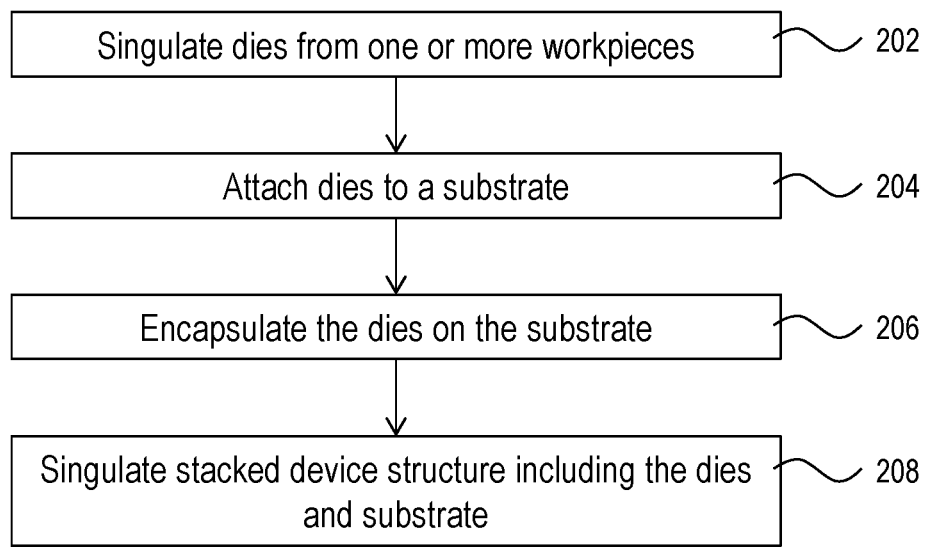
FIG. 7 is a flow chart of a general process for forming a stacked device structure, in accordance with an example of the present disclosure.

FIG. 6 illustrates a stacked device structure after singulating the substrate 62 from the second workpiece 60, which singulation is performed in block 208 of FIG. 7. The portions of the second workpiece 60 and the encapsulant 68 along the scribe lines 66 may be removed by the singulation of the substrates 62. The singulation of the substrate 62 may be by dicing using mechanical sawing, for example.

The general process illustrated in and described with respect to FIGS. 1 through 6 is merely an example process to form a stacked device structure. The flow of operations described may be performed in any logical order. For example, the order in which the substrate 62 is singulated, the dies 42 and 70 are attached to the substrate 62, and/or the encapsulant 68 is formed may be modified and altered to any logical order.

Further, some components in FIGS. 1 through 6 have been described as having specific characteristics and/or being specific components. These are examples intended to convey aspects of examples of the present disclosure. A person having ordinary skill in the art will readily understand various modifications and/or substitutions that may be made to and/or for these components.

First Example Die Singulation Process

Figure 8:
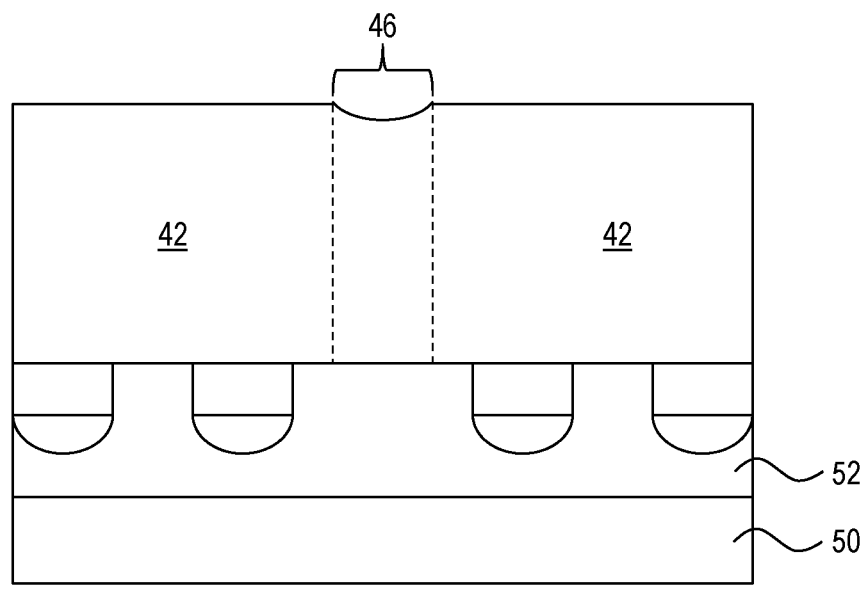
FIGS. 8 and 9 are cross-sectional views of intermediate structures during stages of a first die singulation process, in accordance with examples of the present disclosure.
Figure 9:
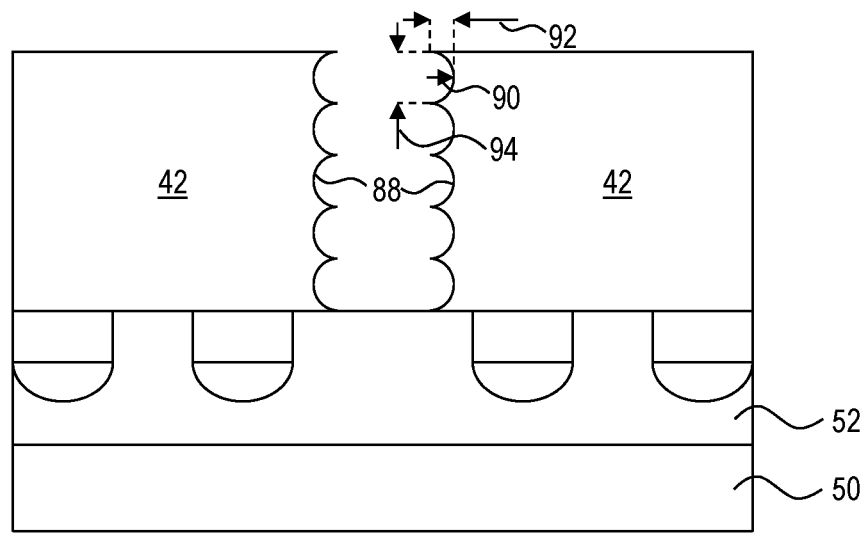
Figure 10:
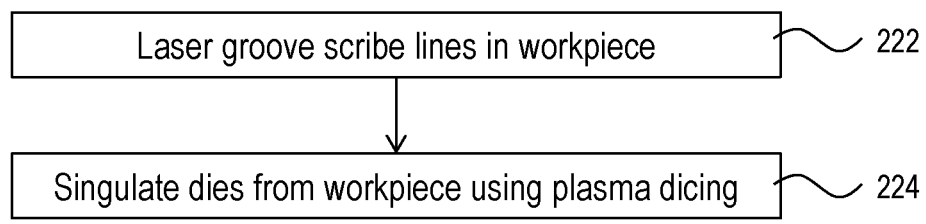
FIG. 10 is a flow chart of the first die singulation process, in accordance with an example of the present disclosure.

FIGS. 8 and 9 illustrate cross-sectional views of intermediate structures during stages of a first die singulation process, in accordance with examples of the present disclosure. FIG. 10 is a flow chart of the first die singulation process, in accordance with an example of the present disclosure. The first die singulation process may be performed at block 202 in FIG. 7.

FIG. 8 illustrates a portion of the intermediate structure of FIG. 2 after laser grooving in the scribe lines 46, which is performed in block 222 of FIG. 10. Then, FIG. 9 illustrates the dies 42 after being singulated using plasma dicing, which is performed in block 224 of FIG. 10. The plasma dicing in this example can use a deep reactive ion etch (DRIE), such as the Bosch DRIE process. The plasma dicing in this example forms undulating sidewalls 88 on the dies 42, e.g., the sidewalls each have a vertical series of concave surfaces.

Each curved surface can have a radius of curvature 90 in a range from about 0.1 μm to about 50 μm, a depth 92 in a range from about 0.1 μm to about 100 μm, and a height 94 in a range from about 0.1 μm to about 100 μm. The radius of curvature 90, depth 92, and height 94 can be controlled by controlling process parameters of the plasma dicing, such as the plasma energy.

Figure 11:
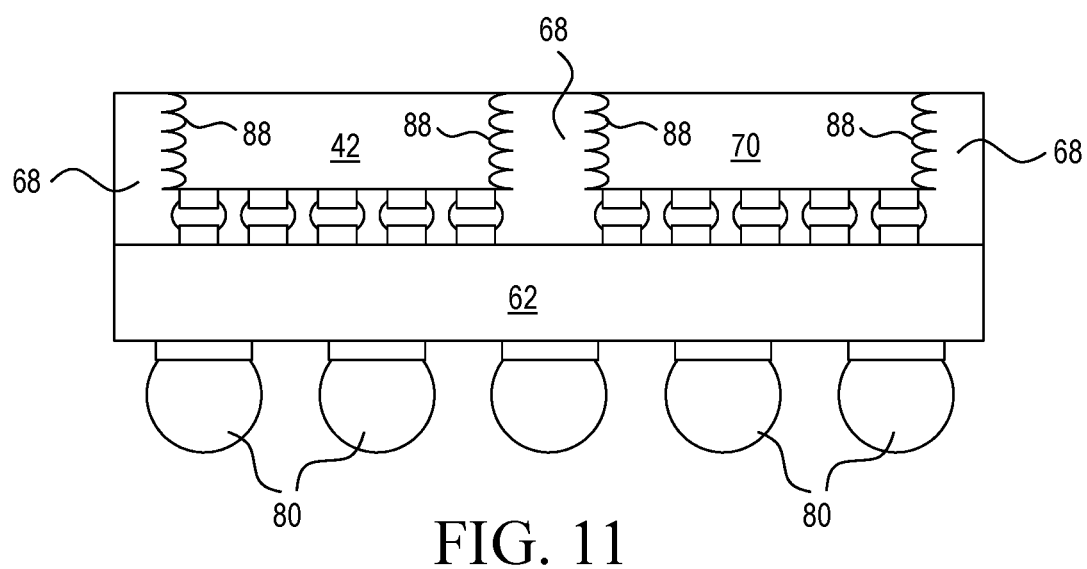
FIG. 11 is a cross-sectional view of a stacked device structure including dies that are singulated from a workpiece using the first die singulation process of FIGS. 8 and 9, in accordance with an example of the present disclosure.

FIG. 11 illustrates a cross-sectional view of a stacked device structure including dies 42 and 70 that are singulated from a workpiece using the first die singulation process of FIGS. 8 and 9, in accordance with an example of the present disclosure. The stacked device structure of FIG. 11 is similar to the stacked device structure of FIG. 6. In FIG. 11, each die 42 and 70 has undulating sidewalls 88 to which the encapsulant 68 adheres.

By using plasma dicing instead of a mechanical sawing process to singulate the dies 42 and 70, defects along sidewalls of the dies 42 and 70 that are induced by mechanical sawing can be avoided. For example, mechanical sawing can induce cracks and chipping along sidewalls of dies. These defects can be caused by, for example, the type of the blade of the dicing saw, the grit size of the blade, vibrations of the blade, and wear and tear of the blade during the mechanical sawing to singulate dies. These defects can be sources for cracks that can propagate into an active portion of a die and/or can be causes for local stress concentration zones. The defects and/or stress caused by the defects can lead to delamination of the encapsulant at the sidewall of the die and/or delamination or cracking of a low-k dielectric layer (e.g., used in an intermetallization layer) on an active side of the die. By avoiding using a mechanical sawing process to singulate the dies 42 and 70, the defects, such as cracking and chipping, induced by mechanical sawing can be avoided. Hence, occurrences of delamination and cracking in a stacked device structure may be reduced, and instances of local stress concentration zones in the stacked device structure may be reduced.

Further, the undulating sidewalls 88 of the dies 42 and 70 have an increased surface area compared to straight, vertical sidewalls, for example, that may be formed using a mechanical sawing process. The encapsulant 68 adheres to this increased surface area, which in turn, permits for greater adhesion between the respective die 42 and 70 and the encapsulant 68. Additionally, the undulating sidewalls 88 of the dies 42 and 70 can reduce the impact of cracking. The increased surface area of the undulating sidewalls 88 can increase a distance a crack would have to propagate to reach an active portion of the dies 42 and 70. Further, the undulating sidewalls 88 can create discontinuities along the sidewalls that can intersect propagating cracks and cause those propagating cracks to terminate propagation. Hence, an adverse impact of cracking in the stacked device structure can be reduced.

Second Example Die Singulation Process

FIGS. 12 through 17 illustrate cross-sectional views of intermediate structures during stages of a second die singulation process, in accordance with examples of the present disclosure. FIG. 18 is a flow chart of the second die singulation process, in accordance with an example of the present disclosure. The second die singulation process may be performed at block 202 in FIG. 7.

Figure 12:
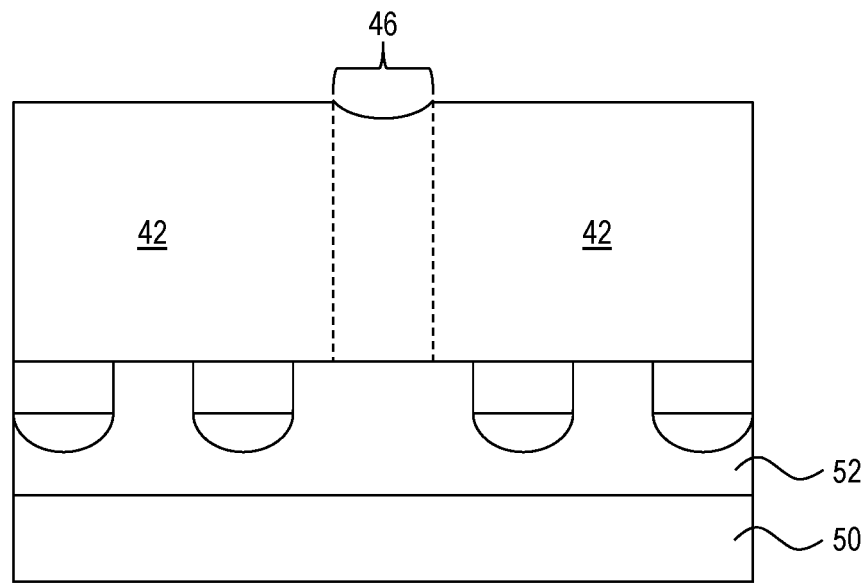
FIGS. 12 through 17 are cross-sectional views of intermediate structures during stages of a second die singulation process, in accordance with examples of the present disclosure.
Figure 13:
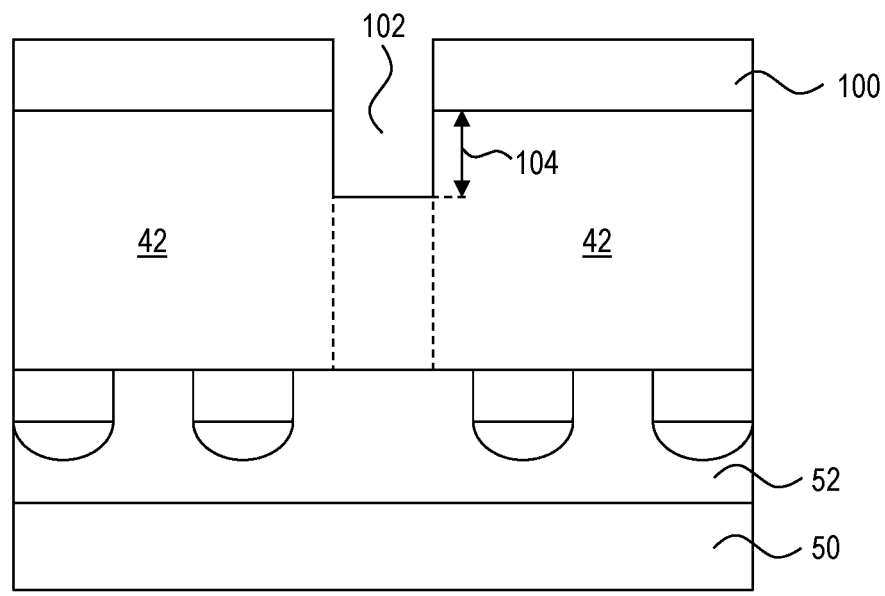

FIG. 12 illustrates a portion of the intermediate structure of FIG. 2 after laser grooving in the scribe lines 46, which is performed in block 232 of FIG. 18. In FIG. 13, a mask 100 is deposited on the back side of the dies 42 and patterned to expose the scribe lines 46, which is performed in block 234 of FIG. 18. The mask 100 can include or be any appropriate hard mask material, such as silicon nitride, silicon oxynitride, silicon carbon nitride, or another material, and can be deposited by spin coating, chemical vapor deposition (CVD), physical vapor deposition (PVD), or another deposition technique. The mask 100 can be patterned using a photolithography and etching process. The mask 100, once patterned, has a mask opening corresponding to the scribe lines 46.

With the mask patterned, the mask 100 may be used during an anisotropic etching process to form a recess 102 with vertical sidewalls in respective scribe lines 46, which is performed in block 236 of FIG. 18. The anisotropic etching process can be a plasma dicing process, a reactive ion etch (RIE), or another anisotropic etching process. The recess 102 may be formed to a depth 104 into the first workpiece 40, where the depth 104 is in a range from about 0.1 μm to about 100 μm.

Figure 14:
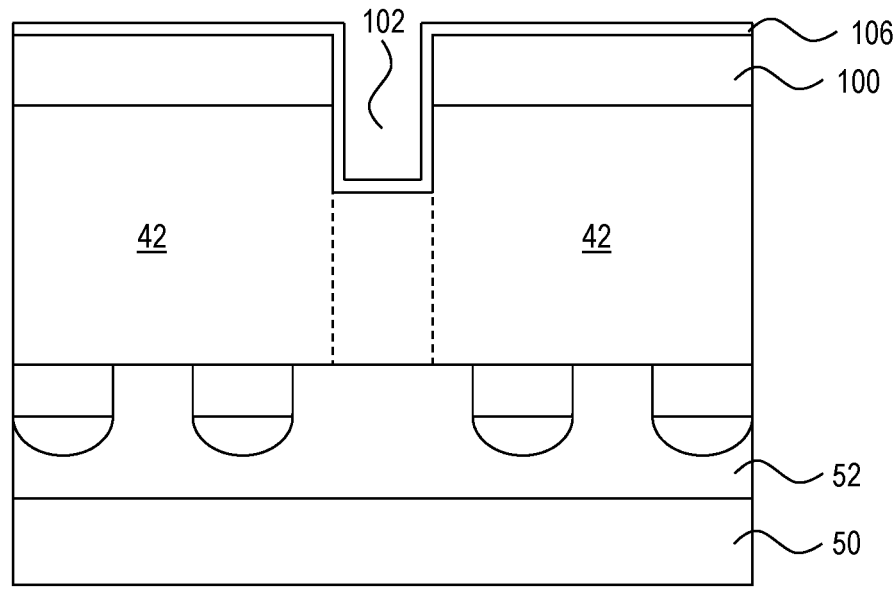
Figure 15:
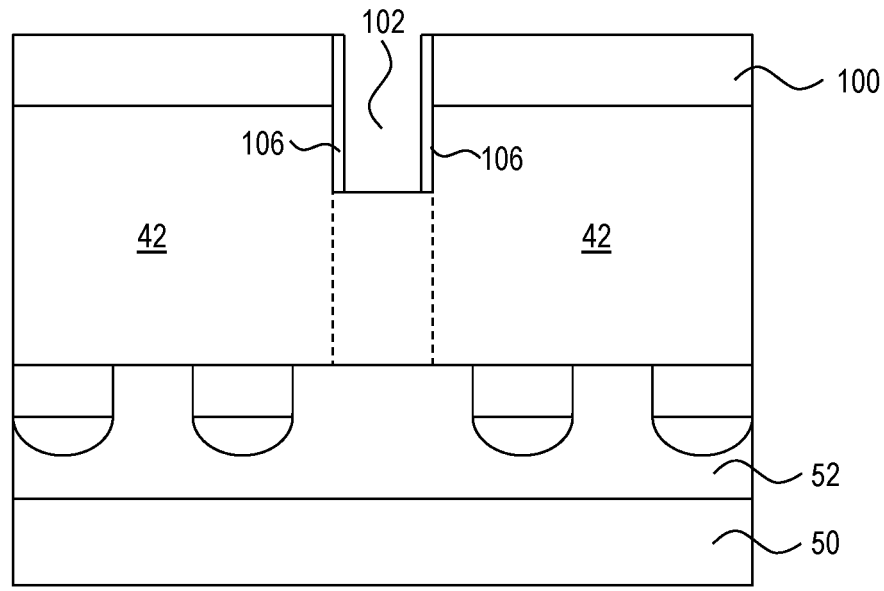

FIGS. 14 and 15 illustrate the formation of a passivation film 106 on sidewalls of the recess 102, which is performed in block 238 of FIG. 18. In the illustrated example, the passivation film 106 is formed independently of the etching process described with respect to FIG. 13, although in other examples, the passivation film 106 on sidewalls of the recess 102 may be formed as a byproduct of the etching process described with respect to FIG. 13. In FIG. 14, the passivation film 106 is conformally deposited on the mask 100 and along sidewalls and on a bottom surface of the recess 102. The passivation film 106 can include or be any material having an etch selectivity different from the material of the first workpiece 40. For example, the passivation film 106 can include or be silicon oxynitride, silicon carbide, silicon carbon nitride, silicon nitride, or another material, and may be deposited using CVD, atomic layer deposition (ALD), or another conformal deposition technique. In FIG. 15, horizontal portions of the passivation film 106 are removed, such as by using an anisotropic etching process, such as a RIE. The passivation film 106 may remain on sidewalls of the recess 102, while a surface of the first workpiece 40 in respective scribe lines 46 (e.g., a bottom surface of the recess 102) may be exposed.

Figure 16:
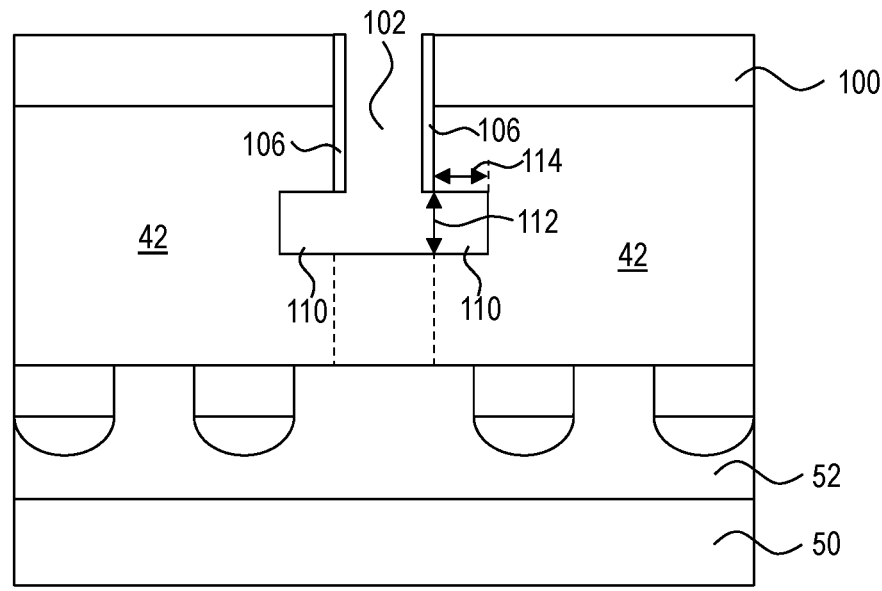

FIG. 16 illustrates the formation of notches 110 in the dies 42 below the passivation film 106, which is performed in block 240 of FIG. 18. The notches 110 may be formed using an isotropic etching process, which may be a RIE, a wet etching process, or another isotropic etching process. The passivation film 106 prevents the etching process from etching the sidewalls of the dies 42 covered by the passivation film 106 (e.g., due to a difference in etch selectivity). The isotropic etching process vertically etches the first workpiece 40 in the scribe lines 46 and laterally etches the dies 42 through the exposed surface along the bottom of the recess 102, which forms the notches 110 in the dies 42. The notches 110 are illustrated as having a square-like profile, although in other examples, the notches 110 can have a semi-circular or semi-oval-like profile. Each notch 110 can have a depth 112 along a corresponding sidewall of the die 42 in a range from about 0.1 μm to about 100 μm, and a depth 114 from the corresponding sidewall into the die 42 in a range from about 0.1 μm to about 100 μm.

Figure 17:
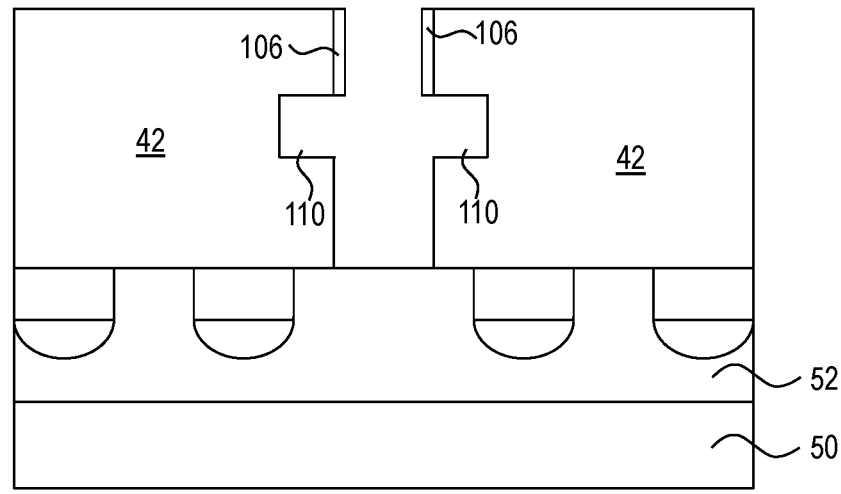
Figure 18:
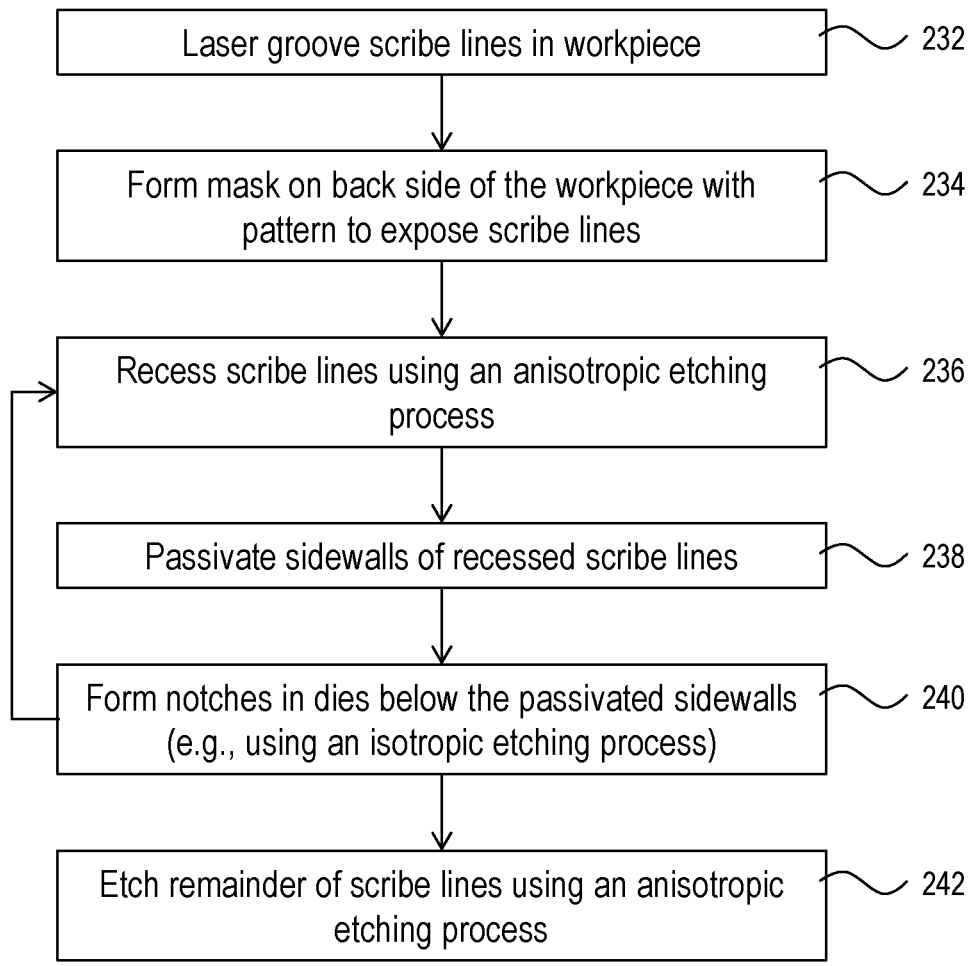
FIG. 18 is a flow chart of the second die singulation process, in accordance with an example of the present disclosure.

FIG. 17 illustrates the further etching to singulate the dies 42, which is performed in block 242 of FIG. 18. An anisotropic etching process may etch through a remainder of the first workpiece 40 in the scribe lines 46. The anisotropic etching process can be a plasma dicing process, a reactive ion etch (RIE), or another anisotropic etching process. The mask 100 may then be removed, such as using a wet etching process, a plasma ashing process, or another process. FIG. 17 illustrates the passivation film 106 remaining on upper portions of the sidewalls of the dies 42 (e.g., above the notches 110). In some examples, the passivation film 106 may be removed by, for example, the process to remove the mask 100 or another process. In other examples, such as when a passivation film is formed as a byproduct of an anisotropic etching process, a passivation film may be along the sidewalls of the dies 42 (e.g., above and below the notches 110) and along surfaces of the notches 110.

Figure 19:
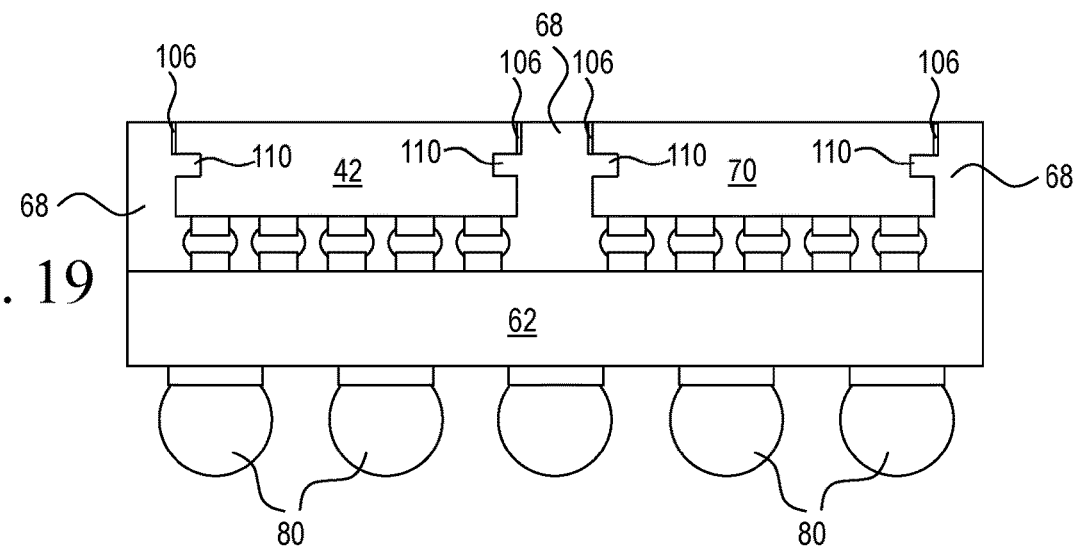
FIG. 19 is a cross-sectional view of a stacked device structure including dies that are singulated from a workpiece using the second die singulation process of FIGS. 12 through 17, in accordance with an example of the present disclosure.

FIG. 19 illustrates a cross-sectional view of a stacked device structure including dies 42 and 70 that are singulated from a workpiece using the second die singulation process of FIGS. 12 through 17, in accordance with an example of the present disclosure. The stacked device structure of FIG. 19 is similar to the stacked device structure of FIG. 6. In FIG. 19, each die 42 and 70 has a respective notch 110 in a sidewall, and the encapsulant 68 is disposed in and adheres to surfaces of each notch 110.

Figure 20:
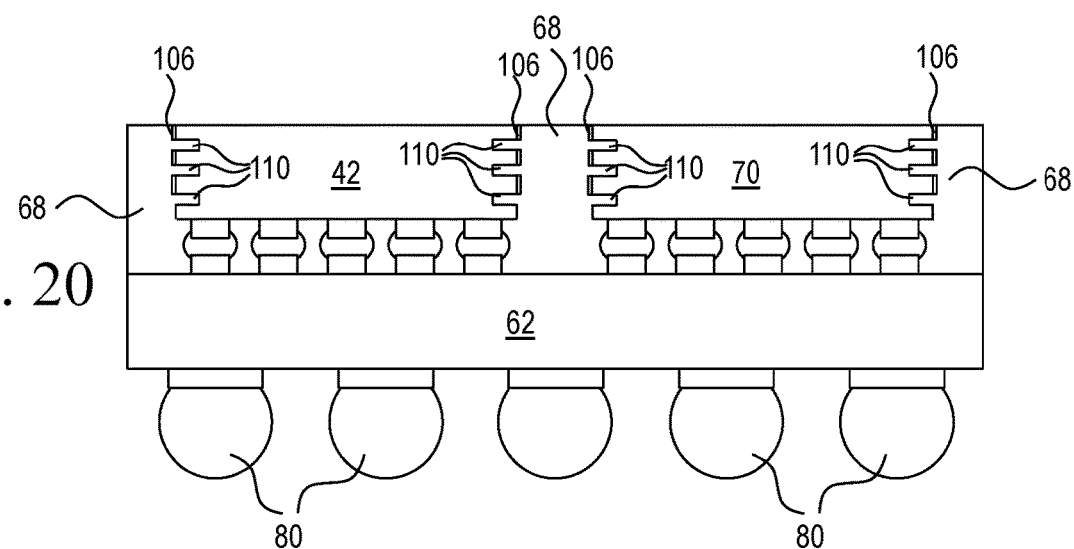
FIG. 20 is a cross-sectional view of a stacked device structure including dies that are singulated from a workpiece using a modified version of the second die singulation process of FIGS. 12 through 17, in accordance with an example of the present disclosure.

FIG. 20 illustrates a stacked device structure including dies 42 and 70 that are singulated from a workpiece using a modified version of the second die singulation process of FIGS. 12 through 17, in accordance with an example of the present disclosure. The stacked device structure of FIG. 20 is similar to the stacked device structure of FIG. 6. In FIG. 20, each die 42 and 70 has multiple notches 110 in the sidewalls, and the encapsulant 68 is disposed in and adheres to surfaces of each notch 110. In the illustrated example, each sidewall of the dies 42 and 70 has three notches 110, and in other examples, each sidewall can have any number of notches 110, such as two, four, or another number. Further, the number of notches 110 in each sidewall of the die 42 can differ from the number of notches 110 in each sidewall of the die 70. Multiple notches 110 can be formed in the sidewalls of the dies 42 and 70 by repeating the etching and passivating operations of FIGS. 13 through 16, and the blocks 236 through 240 of FIG. 18, an appropriate number of times. Depths 104, 112, and 114 can be controlled by controlling an etching process duration and/or etch chemistry to provide appropriate depths to permit a desired number of notches 110 in a sidewall.

As with the first example die singulation process, by using etching instead of a mechanical sawing process to singulate the dies 42 and 70, defects along sidewalls of the dies 42 and 70 that are induced by mechanical sawing can be avoided. By avoiding using a mechanical sawing process to singulate the dies 42 and 70, defects, such as cracking and chipping, induced by mechanical sawing can be avoided. Hence, occurrences of delamination and cracking in a stacked device structure may be reduced, and instances of local stress concentration zones in the stacked device structure may be reduced.

Further, the sidewalls of the dies 42 and 70 having one or more notches 110 have an increased surface area compared to straight, vertical sidewalls, for example, that may be formed using a mechanical sawing process. The encapsulant 68 adheres to this increased surface area, which in turn, permits for greater adhesion between the respective die 42 and 70 and the encapsulant 68. The notches 110 in neighboring dies 42 and 70 can provide an internal lock using the encapsulant 68. Additionally, the sidewalls of the dies 42 and 70 having one or more notches 110 can reduce the impact of cracking. The increased surface area of the sidewalls can increase a distance a crack would have to propagate to reach an active portion of the dies 42 and 70. Further, the notches 110 can create discontinuities along the sidewalls that can intersect propagating cracks and cause those propagating cracks to terminate propagation. Even further, the notches 110 can provide an alternate stress concentration zone. By placing notches 110 away from the active portion of the die 42 and 70, cracks can be diverted away from the active portion of the die 42 and 70. Hence, an adverse impact of cracking in the stacked device structure can be reduced.

Third Example Die Singulation Process

Figure 23:
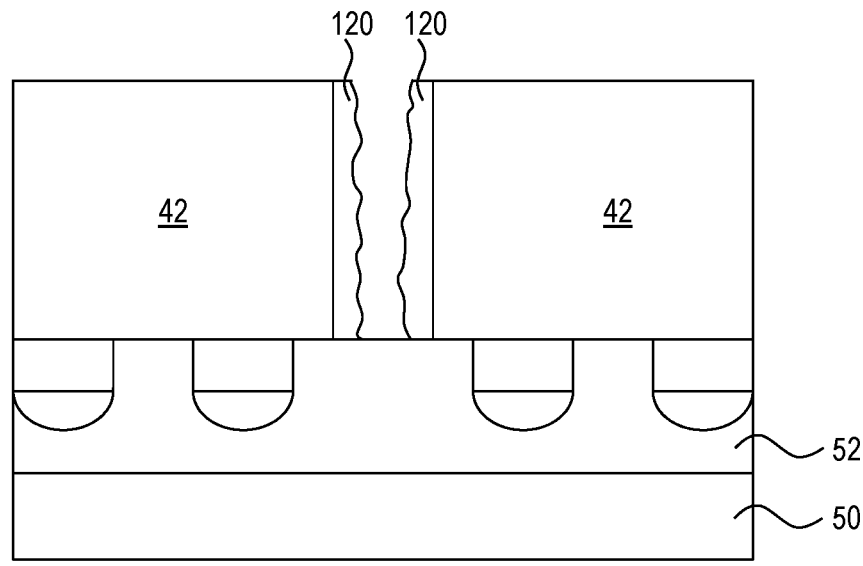
Figure 24:
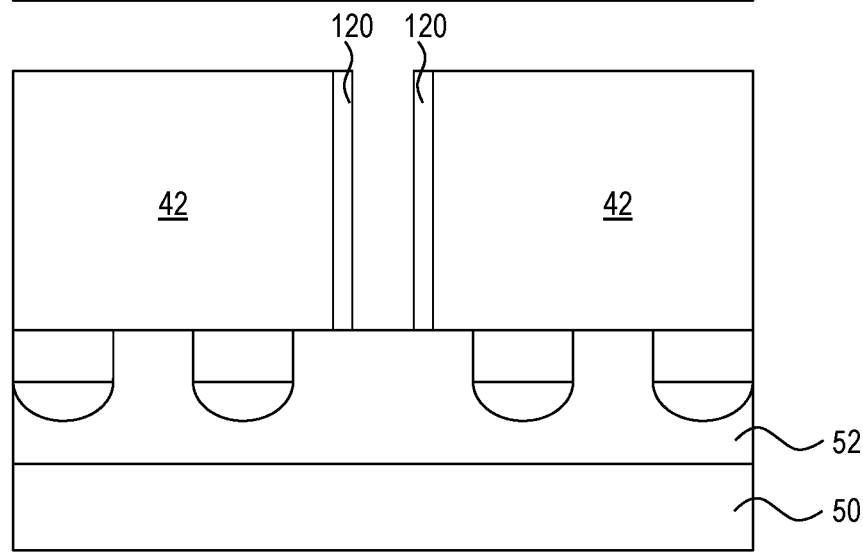
Figure 25:
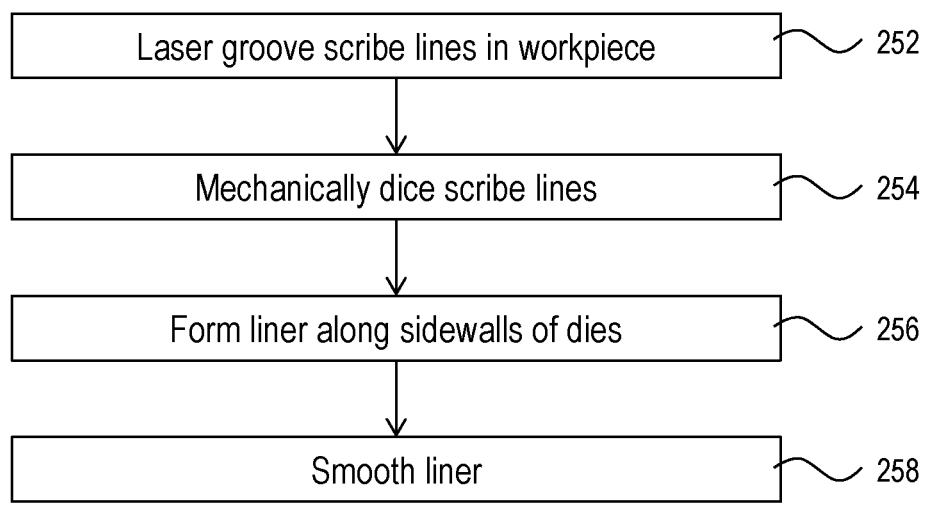
FIG. 25 is a flow chart of the third die singulation process, in accordance with an example of the present disclosure.

FIGS. 21 through 24 illustrate cross-sectional views of intermediate structures during stages of a third die singulation process, in accordance with examples of the present disclosure. FIG. 25 is a flow chart of the third die singulation process, in accordance with an example of the present disclosure. The third die singulation process may be performed at block 202 in FIG. 7.

Figure 21:
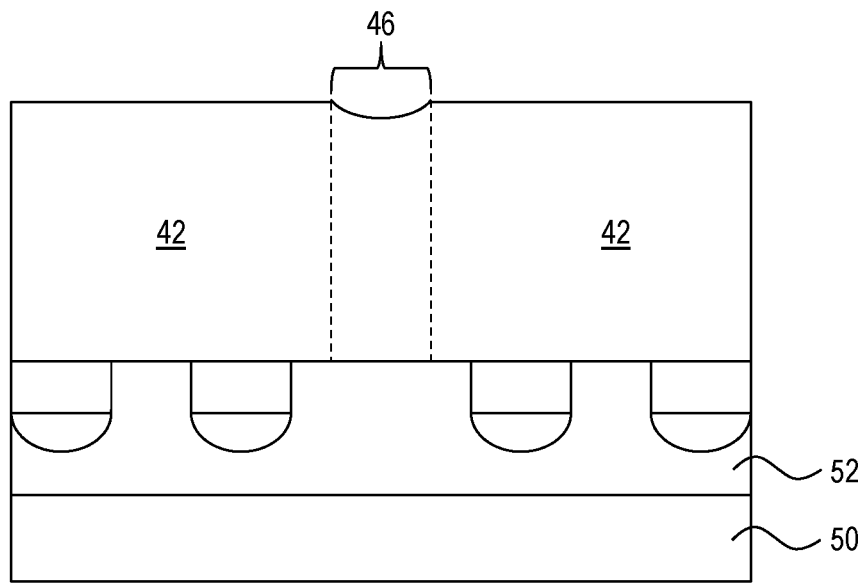
FIGS. 21 through 24 are cross-sectional views of intermediate structures during stages of a third die singulation process, in accordance with examples of the present disclosure.
Figure 22:
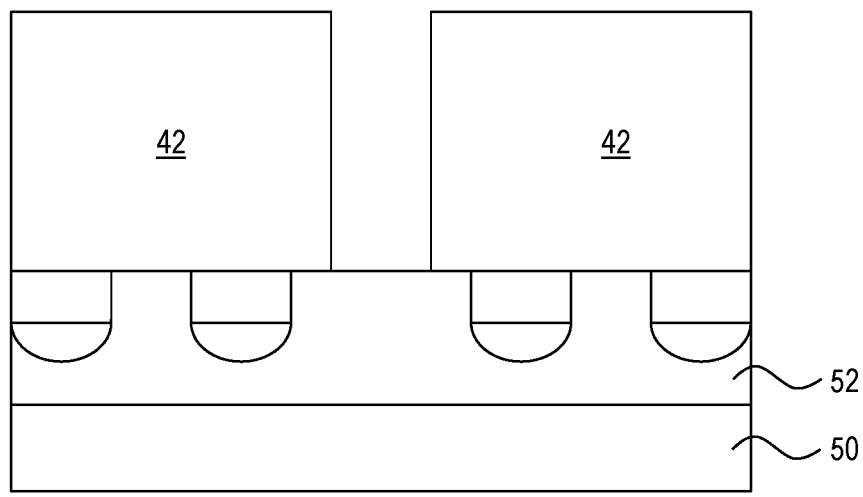

FIG. 21 illustrates a portion of the intermediate structure of FIG. 2 after laser grooving in the scribe lines 46, which is performed in block 252 of FIG. 25. Then, FIG. 22 illustrates the dies 42 after being singulated using, for example, mechanical dicing (e.g., mechanical sawing) along scribe lines 46, which is performed in block 254 of FIG. 25.

FIG. 23 illustrates the formation of a liner 120 along sidewalls of the dies 42, which is performed in block 256 of FIG. 25. The liner 120 can include or be a nitride, such as silicon nitride, or another material, and can be formed using spin coating, CVD, or another deposition process. FIG. 24 illustrates smoothing the liner 120, which is performed in block 258 of FIG. 25. For example, an etching process may be used to smooth the liner 120 to achieve a smooth exterior surface of the liner 120. An oblique directional etching process and/or isotropic etching process may be implemented to smooth the exterior surface of the liner 120, for example. In some examples, the smoothing operation of FIG. 24 may be omitted, such as when the liner 120 is deposited with a sufficient smoothness. In some examples, a thickness of the liner 120 (e.g., in a direction perpendicular to the supporting sidewall of the die) is in a range from about 0.1 μm to about 100 μm. In some examples, a surface roughness of an exterior surface is in a range from about 0.1 nm RMS to about 1,000 nm RMS.

Figure 26:
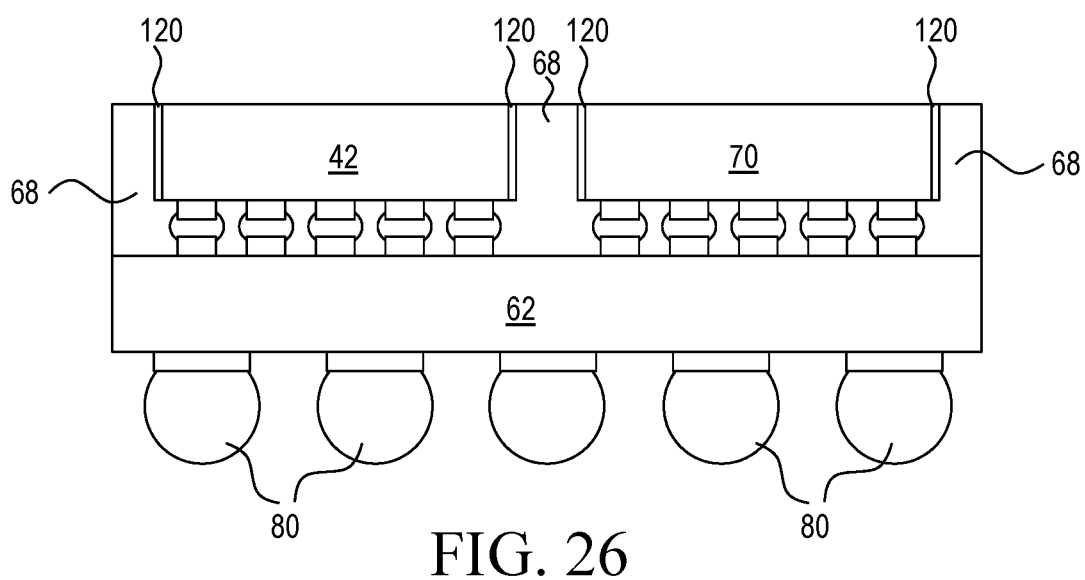
FIG. 26 is a stacked device structure including dies that are singulated from a workpiece using the third die singulation process of FIGS. 21 through 24, in accordance with an example of the present disclosure.

FIG. 26 illustrates a stacked device structure including dies 42 and 70 that are singulated from a workpiece using the third die singulation process of FIGS. 21 through 24, in accordance with an example of the present disclosure. The stacked device structure of FIG. 26 is similar to the stacked device structure of FIG. 6. In FIG. 26, each die 42 and 70 has straight, vertical sidewalls on which a respective liner 120 is formed. The encapsulant 68 adheres to the liners 120.

By using liners 120 along sidewalls of the dies 42 and 70, any defect along the sidewalls of the dies 42 and 70 that is induced by the mechanical sawing process may be covered by a liner 120. The covering of defects by a liner 120 can reduce or mitigate against an impact that the defects may have on the encapsulant 68. Further, the liners 120 can be a stress buffer layer that can prevent cracks from propagating beyond the respective liners 120.

Although the stacked device structures of FIGS. 11, 19, 20, and 26 are illustrated with and described as including two dies 42 and 70 formed according to the example processes described herein, in some examples, a stacked device structure may include one die formed according to one of the example processes described herein and one or more dies singulated using a mechanical sawing process. A stacked device structure according to examples of the present disclosure can include any number of dies singulated according to any example processes described herein, and further, the stacked device structure can include any number of dies singulated using a mechanical sawing process.

Aspects of some examples of the present disclosure can permit for a more robust stacked device structure. As described above, impacts of defects that are induced by mechanical sawing can be obviated or mitigated. This permits a stacked device structure to be more reliable and less likely to have a defect induce failure of the stacked device structure. Accordingly, stacked device structures formed according to some examples described herein may be more appropriate for applications that require high reliability, such as automotive, military, or aerospace applications.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method of integrated circuit packaging, comprising:
   prior to removing material from a first scribe line on both a back surface and a front surface of a first workpiece, attaching the first workpiece to a support structure along the front surface of the first workpiece, wherein the front surface of the first workpiece includes an active device;
   after attaching the first workpiece to the support structure, singulating a first die from the first workpiece using a two-step singulation process, wherein a first step of the two-step singulation process includes forming a groove in the first scribe line on the back surface of the first workpiece using a process other than a plasma etching process, wherein a second step of the two-step singulation process includes chemically removing material, using a uniform etching condition, from the first workpiece in the first scribe line starting from the groove on the back surface and continuing through to the front surface of the first workpiece, wherein the second step of the two-step singulation process includes the plasma etching process, wherein the two-step singulation process exposes a first sidewall of the first die, and wherein the first sidewall has a first plurality of curved surfaces;
   after singulating the first die, separating the first die from the support structure and attaching the first die to a first area of a substrate;
   attaching a second die to a second area of the substrate, the second die having a second sidewall exposed by another two-step singulation process, wherein the second sidewall includes a second plurality of curved surfaces; and
   forming an encapsulant on the substrate, wherein the encapsulant is adhered to a first surface of the first plurality of curved surfaces and to a second surface of the second plurality of curved surfaces.

2. The method of claim 1, wherein chemically removing the material from the first workpiece comprises using the plasma etching process.

3. The method of claim 1, wherein chemically removing the material from the first workpiece comprises using a deep reactive ion etching process.

4. The method of claim 1, wherein chemically removing the material from the first workpiece comprises:
   anisotropically etching the first workpiece in the first scribe line.

5. The method of claim 1, wherein chemically removing the material from the first workpiece forms the first sidewall of the first die, the first sidewall of the first die being undulating and including the first plurality of curved surfaces, wherein a surface area of each curved surface of the first plurality of curved surfaces is equal.

6. The method of claim 1, wherein chemically removing the material from the first workpiece forms the first sidewall of the first die.

7. The method of claim 1, wherein chemically removing the material from the first workpiece comprises:
   repeatedly:
   etching the first workpiece.

8. The method of claim 1, wherein the first plurality of curved surfaces and the second plurality of curved surfaces have a substantially uniform pitch.

9. The method of claim 1, wherein the second sidewall of the second die is undulating and includes the second plurality of curved surfaces, wherein a surface area of each curved surface of the second plurality of curved surfaces is equal.

10. The method of claim 1, further comprising:
    after forming the encapsulant on the substrate, forming a redistribution layer on a back side of the substrate; and
    forming a plurality of electrical connectors on the back side of the substrate, wherein the plurality of electrical connectors are electrically connected to the redistribution layer.

11. The method of claim 1, wherein the encapsulant includes a molding material.

12. The method of claim 1, wherein the substrate includes an interposer that is part of a second workpiece.

13. The method of claim 12, further comprising:
    after forming the encapsulant on the substrate, singulating a stacked device from the second workpiece, the stacked device comprising the first die, the second die, the interposer, and at least part of the encapsulant.

14. The method of claim 1, wherein the attaching the first die to the first area of the substrate comprises performing a first reflow process to physically and electrically connect first electrical connectors on the first die to second electrical connectors on first area of the substrate.

15. The method of claim 14, wherein the attaching the second die to the second area of the substrate comprises performing a second reflow process to physically and electrically connect third electrical connectors on the second die to fourth electrical connectors on the second area of the substrate.

16. A method of integrated circuit packaging, the method comprising:
    bonding a first workpiece to a substrate along a front side of the first workpiece, wherein the front side of the first workpiece includes an active device, and wherein a scribe line on both front and back sides of the first workpiece remains unetched;
    after bonding the first workpiece to the substrate, singulating a first die from the first workpiece, singulating the first die comprising:
    laser grooving the scribe line on the back side of the first workpiece opposite the front side of the first workpiece; and performing a deep reactive ion etch (DRIE) in the laser grooved scribe line on the back side of the first workpiece, the DRIE being performed from the laser grooved scribe line completely through the first workpiece to the front side of the first workpiece, the DRIE forming a first undulating sidewall of the first die, the first undulating sidewall including a plurality of curved surfaces having a substantially uniform pitch from the back side to the front side of the first workpiece;

after singulating the first die, separating the first die from the substrate and attaching the first die to an interposer that is part of a second workpiece, a second die being attached to the interposer of the second workpiece, the second die having a second sidewall;

encapsulating the first die and the second die on the interposer of the second workpiece with a molding material, the molding material being adhered to the first undulating sidewall and the second sidewall; and singulating a stacked device from the second workpiece, the stacked device comprising the first die, the second die, the interposer, and the molding material encapsulating the first die and the second die on the interposer.

17. The method of claim 16, wherein each of the curved surfaces has a radius of curvature in a range from 0.1 μm to 50 μm.

18. The method of claim 16, wherein each of the curved surfaces has a depth in a range from 0.1 μm to 100 μm, the depth being in a direction orthogonal to a plane substantially along the first undulating sidewall.

19. The method of claim 16, wherein each of the curved surfaces has a height of curvature in a range from 0.1 μm to 100 μm, the height being in a direction parallel to a plane substantially along the first undulating sidewall.

20. The method of claim 16, wherein the second sidewall is a second undulating sidewall.

* * * * *